United States Patent
Hong

(10) Patent No.: US 10,416,361 B2
(45) Date of Patent: Sep. 17, 2019

(54) MULTIPLE SUNLIGHT COLLECTION STRUCTURE

(71) Applicant: Ki Ho Hong, Seoul (KR)

(72) Inventor: Ki Ho Hong, Seoul (KR)

( * ) Notice: Subject to any disclaimer, the term of this patent is extended or adjusted under 35 U.S.C. 154(b) by 0 days.

(21) Appl. No.: 15/690,837

(22) Filed: Aug. 30, 2017

(65) Prior Publication Data

US 2017/0363782 A1    Dec. 21, 2017

Related U.S. Application Data

(63) Continuation of application No. 13/990,037, filed as application No. PCT/KR2011/008691 on Nov. 15, 2011, now abandoned.

(30) Foreign Application Priority Data

Nov. 27, 2010    (KR) ........................ 10-2010-0119245

(51) Int. Cl.
| | | |
|---|---|---|
| G02B 5/10 | (2006.01) | |
| F21S 11/00 | (2006.01) | |
| G02B 19/00 | (2006.01) | |
| G01J 1/04 | (2006.01) | |

(Continued)

(52) U.S. Cl.
CPC .............. *G02B 5/10* (2013.01); *F21S 11/00* (2013.01); *F24S 23/12* (2018.05); *F24S 23/71* (2018.05);

(Continued)

(58) Field of Classification Search
CPC .. G02B 5/10; G02B 19/0023; G02B 19/0042; G02B 19/0028; H01L 31/0547

(Continued)

(56) References Cited

U.S. PATENT DOCUMENTS

| | | | |
|---|---|---|---|
| 4,586,488 | A | 5/1986 | Noto |
| 6,299,317 | B1 | 10/2001 | Gorthala |

(Continued)

FOREIGN PATENT DOCUMENTS

| | | |
|---|---|---|
| JP | H0142885 Y2 | 12/1989 |
| JP | H0547907 U | 6/1993 |
| JP | 2003227661 A | 8/2003 |

*Primary Examiner* — Avinash A Savani
*Assistant Examiner* — Rabeeul I Zuberi
(74) *Attorney, Agent, or Firm* — STIP Law Group, LLC

(57) ABSTRACT

The present invention relates to a method for collecting sunlight through an image method by tracking the sun using a dish-shaped light collector or a paraboloidal light collector and, and to a method and an apparatus for transmitting high-density light as the collected sunlight to a remote place, to which the light is applied, and for generating super-high-density light by combining, in a multi-stage manner, the high-density light obtained through a plurality of light collectors. A first concaveparaboloidal reflector of a paraboloidal light collection unit can collect light, transmit the collected light to the remote place, and provide an efficient and quantitative use environment to an applied device by using a paraboloidal reflector set including: a first concave-paraboloidal mirror in which a slope of a paraboloide is provided to make a narrow width so that downward reflection is greater than or equal to 90% by an angle between an incident angle at an inner point of a paraboloidal mirror and a normal surface, the angle being larger than a critical angle, and which has an opening formed at the lower side of a central axis thereof; and a second convex-paraboloidal reflector, which has a small diameter, shares a focus of the first concave-paraboloidal mirror, and has a miniaturized shape of the first concave-paraboloidal mirror at a focal portion without an opening at a central axis thereof.

5 Claims, 7 Drawing Sheets

(51) Int. Cl.
    *H01L 31/054*     (2014.01)
    *F24S 23/79*     (2018.01)
    *F24S 23/00*     (2018.01)
    *F24S 23/71*     (2018.01)
    *F21V 8/00*     (2006.01)

(52) U.S. Cl.
    CPC ............ *F24S 23/79* (2018.05); *G01J 1/0407* (2013.01); *G02B 19/0023* (2013.01); *G02B 19/0028* (2013.01); *G02B 19/0042* (2013.01); *H01L 31/0547* (2014.12); *G02B 6/0006* (2013.01); *Y02E 10/42* (2013.01); *Y02E 10/52* (2013.01)

(58) Field of Classification Search
    USPC .......................................... 359/853; 126/690
    See application file for complete search history.

(56) References Cited

U.S. PATENT DOCUMENTS

| | | | |
|---|---|---|---|
| 6,385,371 B1 | 5/2002 | Li | |
| 6,618,530 B1 | 9/2003 | Lundin | |
| 8,007,157 B2 | 8/2011 | Lin | |
| 2004/0031517 A1* | 2/2004 | Bareis | F24J 2/07 136/246 |
| 2006/0018427 A1 | 1/2006 | Pflaum | |
| 2007/0187104 A1* | 8/2007 | Mecham | E21B 43/24 166/302 |
| 2008/0137205 A1* | 6/2008 | Spencer | F24J 2/18 359/601 |
| 2009/0013990 A1 | 1/2009 | Mattioli | |
| 2011/0073149 A1 | 3/2011 | Ladner | |

* cited by examiner

MULTIPLE SUNLIGHT COLLECTION STRUCTURE

CROSS-REFERENCE TO RELATED APPLICATIONS

This application is a continuation of application Ser. No. 13/990,037, filed May 28, 2013 which in turn claims the benefit of International Application No. PCT/KR2011/008691, filed Nov. 15, 2011, which in turn claims the benefit of Korean Patent Application No. 10-2010-0119245, filed Nov. 27, 2010, the disclosures of which are incorporated by reference into the present application.

TECHNICAL FIELD

The present invention relates to a method and structure for collecting sunlight that form a parallel beam by collection sunlight of a natural state in a high density using a paraboloidal reflector, and light transmitting technology of concentrating high density light in a super high density by combining in a multistage manner and transmitting sunlight collected in a super high density to a remote place, and checking and selectively adjusting a quantity of sunlight of a super high density and transmitting the sunlight with high efficiency while blocking, separating, and combining the sunlight.

BACKGROUND ART

US Patent Laid-Open Publication No. 2008-0092877 relates to a method of collecting sunlight at a focus using a fresnel lens, reflecting the sunlight to a plane reflector, reflecting the sunlight downward to a central funnel type reflector, collecting the sunlight, and transmitting the sunlight to a transmitting pipe, but when plane reflected light is applied to a funnel type (cone type) downward reflector, light is radially reflected and thus parallel light is not formed and collected, whereby even if light is returned to the pipe, the light becomes diffused reflection light, and when light is transmitted to a remote place, much transmission loss occurs, and particularly, when light passes through a joint portion or a bending portion, much light loss occurs and thus the method has very bad transmitting efficiency and cannot transmit intended light.

Korean Patent Laid-Open Publication No. 1983-0009444, Korean Patent Laid-Open Publication No. 1989-000905, and Korean Patent Laid-Open Publication No. 1988-058282 relates to a method of collecting light using a convex lens and transmitting the light to an optical fiber, and as chromatic aberration and diffused reflection occur, transmitting efficiency is very bad, and thus the method cannot transmit high density light to a remote place.

Korean Patent Laid-Open Publication No. 10-2003-0027529 relates to a method of forming a small module with a plurality of small dish type reflectors, a second reflector provided at a periphery of a focus of each reflector, each second reflector, and an optical fiber bundle formed with optical fibers disposed directly under the each second reflector and for applying collected sunlight and transmitting sunlight to a far separated absorber using the optical fibers and performing thermal conversion of the sunlight, and in this time, because light of wave lengths in a ultraviolet ray area and a far infrared ray area is absorbed to the optical fiber, thermal efficiency is not good, and while transmitting the sunlight, a loss by diffused reflection occurs in a bending portion of a transmission pipe and thus transmitting efficiency is not good.

DISCLOSURE

Technical Problem

The present invention is made to overcome the above mentioned problems, and it is an object of the present invention to develop collecting technology and transmitting technology in order to highly concentrate sunlight and to transmit the sunlight to a super remote place; to minimize a loss of sunlight while preventing a heat from occurring in parts to which sunlight is applied when collecting sunlight using a paraboloidal reflector; to improve transmitting efficiency in order to transmit sunlight of an entire wave length area to a remote place; and to simplify a structure of a product and to improve weather resistance in order to easily perform mass production and maintenance.

Another object of the present invention is to reduce a light loss and to improve light collecting efficiency in order to obtain a transmitting rate of high efficiency; and to form sunlight in super concentration by combining sunlight in a multistage manner and to improve light collecting and transmitting efficiency.

Another object of the present invention is to combine diffused reflected sunlight in high concentration.

Technical Solution

To achieve the above objects, in order to enable parts for reflecting applied sunlight to perform total reflection, a gradient of a reflector is changed to an applied angle to be larger than a threshold angle, an aspheric reflector is formed in two layers, and by forming a reflecting path that passes through a through-hole in a lower portion, applied parallel light is formed in parallel concentration light.

By enabling parts that receive sunlight of a high temperature for a long time to perform total reflection, an absorption heat of light is prevented from being transferred to the parts, and in order to prevent a foreign substance from be stacked at an inlet of a first reflector, the inlet of the first reflector is formed with a transparent protective film.

Further, when collecting sunlight, sunlight can be transmitted as parallel light even at a flexure segment by a joint portion for minimizing the flexure segment, and at a segment of a predetermined distance or more, and by installing an alignment device for aligning transmitting light to parallel light, even if sunlight is transmitted to a super remote place, a loss of sunlight is minimized and thus transmitting efficiency is maximized.

By detecting a light quantity of sunlight with a filtering valve system at a necessary segment, a transmission amount is adjusted, light can be dispersed with a filtering valve on a wave length basis, and a use amount of sunlight in an absorber or a reacting path can be adjusted.

Hereinafter, a core principle of the present invention will be described.

Referred to FIG. 5, a first paraboloidal reflector 1 and a second paraboloidal reflector 4 sharing a focus F with the first paraboloidal reflector 1 exist, and when two applied light vertically applied to the paraboloidal reflectors are AB and DC, respectively and when a transmission line thereof is BA' and CD', if the two applied light and the transmission line are parallel, by an optical principle of a paraboloid, applied light AB applied to the first paraboloidal reflector is reflected to F, and applied light DC applied to the second paraboloidal reflector is reflected to F.

In this case, $$\angle ABF = \angle DCF = k \quad (1)$$

Further, when a virtual image focus of F is F', AA' is parallel to DD'.

$$\angle D'CF' = \angle A'BF' = k \quad (2)$$

by Equation (1) and (2),

AB is parallel to CD'.

That is, applied light AB vertically applied to the first paraboloidal reflector 1 and light CD' reflected by the second paraboloidal reflector 4 become parallel light.

Further, when a line vertical to a circumscribed surface at a point B is MM', an applied angle ∠ABM is k/2, and in this case, when an angle k/2 is larger than a threshold angle, total reflection is performed.

When an outer edge segment of the first paraboloidal reflector 1, which is a substantial collection area is W, an internal segment covered by the second paraboloidal reflector 4 is V, and when a lower opening of the first paraboloidal reflector is S, S=V and W>V, and in this case, a light collection area ratio is largest.

In an exemplary embodiment of the present invention, as shown in FIG. 5, in a first paraboloidal reflector in which ∠ABM is smaller than a threshold angle, in order to advance reflected light downward, the second paraboloidal reflector should be formed in a upward convex form.

Advantageous Effects

As described above, when collecting sunlight into parallel sunlight using the paraboloidal reflector, and when transmitting the sunlight using a light pipe, by forming an applied angle to be larger than a threshold angle, total reflection can occur and thus a heat does not occur in parts to which sunlight is applied and a loss of sunlight does not occur, whereby sunlight can be effectively collected and transmitted.

BEST MODES FOR CARRYING OUT THE INVENTION

Figure 1:
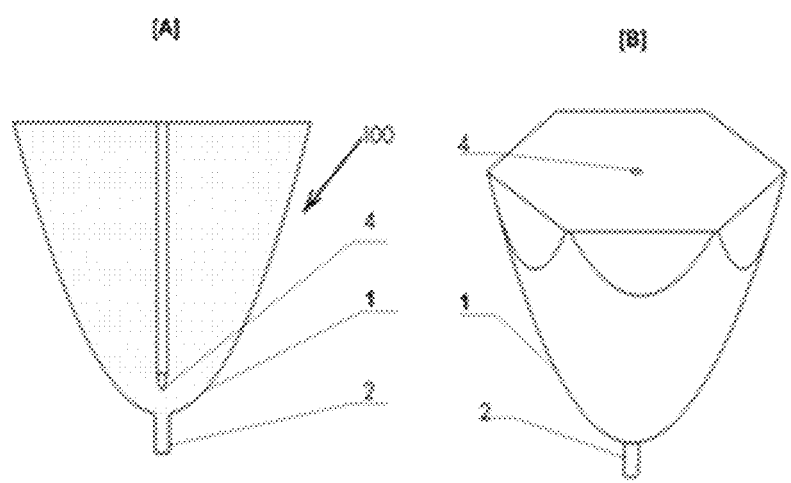
FIG. 1 illustrates a longitudinal section (A) and perspective view (B) of a first light collecting device according to an exemplary embodiment of the present invention.

Hereinafter, an exemplary embodiment of the present invention will be described in detail with reference to the drawings.

Referring to FIG. 1 to 4, The present invention includes a first light collecting device 100 for receiving and collecting sunlight;

a light transmitting pipe 2 for transferring sunlight to another location; and a sunlight collecting unit 3 for collecting sunlight at one location with a plurality of light transmitting pipes 2 and for forming the sunlight into one light.

When sunlight is reflected to a first paraboloidal reflector 1, by maintaining an applied angle to be larger than a threshold angle at a contact point, a paraboloid is formed to occur total reflection, and in a lower portion of the first paraboloidal reflector 1, a second paraboloidal reflector 4 for reflecting again reflected sunlight and transferring the sunlight to the light transmitting pipe 2 is formed.

The second aspheric reflector 4 shares a focus with the first paraboloidal reflector 1, has a reduced form, and reflects sunlight downward, when sunlight is applied to a lower side surface of the first paraboloidal reflector 1, and by forming an applied angle to be larger than a threshold angle, total reflection occurs, and thus a heat does not occur at the second paraboloidal reflector 4, whereby deformation and loss does not occur at the second aspheric reflector 4.

Further, in an upper end portion of the first paraboloidal reflector 1, a transparent body formed with glass or a synthetic resin is mounted to prevent rainwater, dust, or a foreign substance from being injected to the inside and thus sunlight can be effectively collected.

Figure 3:
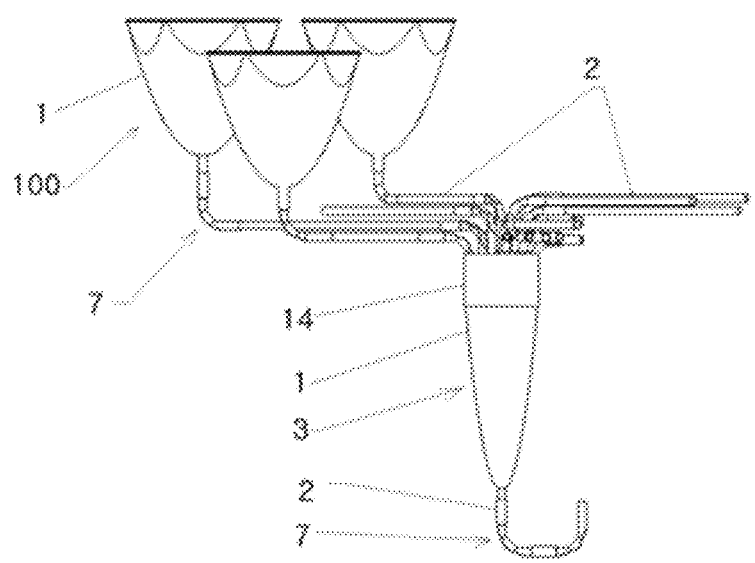
FIG. 3 illustrates a perspective view of Multiple bond of a sunlight collection unit according to an exemplary embodiment of the present invention.
Figure 4:
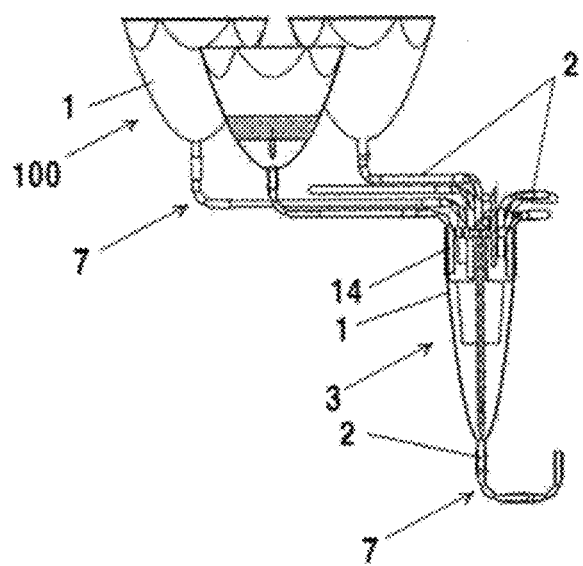
FIG. 4 illustrates a perspective view of a light transmitting pipe and a joint portion according to an exemplary embodiment of the present invention.

As shown in FIGS. 3 and 4, Sunlight collected from a first paraboloidal reflector 1 and a second paraboloidal reflector 4 is transmitted to a remote place through the light transmitting pipe 2, and in a bending portion and a joint portion of the light transmitting pipe 2, two reflectors 6 are mounted to enable an applied angle of sunlight to be larger than a threshold angle and thus total reflection occurs, whereby a heat does not occur in the reflector 6 and a thermal loss is prevented.

In the light transmitting pipe 2, a joint portion 7 is formed, the light transmitting pipe 2 can freely rotate, and in the joint portion 7, two reflectors 9 are mounted to form an applied angle to be larger than a threshold angle and thus total reflection occurs, and the joint portion 7 can rotate, and in a lower portion of the joint portion 7, a connection pipe is formed.

The connection pipe can change a direction while rotating.

When a plurality of joint portions are connected, sunlight can be transmitted in a vertical and lateral direction.

At one side of the light transmitting pipe 2, the sunlight block valve is installed, and thus when sunlight is unnecessary, by closing the sunlight block valve, sunlight is not passed through.

The sunlight block valve is mounted across the light transmitting pipe 2, and at one side thereof, a motor is formed, and by forming a penetration pipe and a block plate adjacent to the motor, while the sunlight block valve laterally moves by the motor, the sunlight block valve passes through or blocks sunlight.

Further, by mounting a sunlight sensor unit at one side of the sunlight block valve, the sunlight sensor unit determines whether sunlight passes through, and when a work is performed, the sunlight sensor unit can recognize the work.

In order to collect sunlight collected by two or more first paraboloidal reflectors 1 at one location through the light transmitting pipe 2, the sunlight collecting unit 3 is mounted in an intermediate portion.

In order to achieve the above object, in the sunlight collecting unit 3, in order to enable parts for reflecting applied sunlight to perform total reflection, a structure of the parts is formed so that an applied angle is larger than a threshold angle, By enabling parts that receive sunlight of a high temperature for a long time to perform total reflection, a heat is not transferred to the parts, and in order to prevent a thermal loss, in order to maintain an applied angle to be larger than a threshold angle, a paraboloid is formed, and at the inside that shares a focus, the second paraboloidal reflector 4 is mounted, and at the central part side of the narrowing inside, a focus is shared and thus sunlight advances in one side direction.

the sunlight collecting unit 3 is a device for collecting sunlight separated into several sunlight at one location and integrating to one light and may be installed in several pieces.

When only one paraboloidal reflector 1 is used, the sunlight collecting unit 3 is unnecessary, and when two or more paraboloidal reflectors 1 are used, by connecting the two or more paraboloidal reflectors 1, the two or more paraboloidal reflectors 1 collects sunlight.

Figure 2:
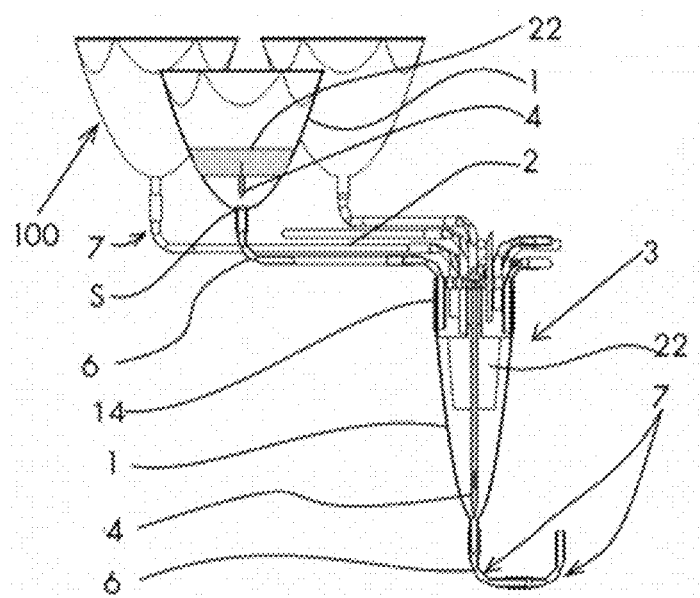
FIG. 2 illustrates a first light collecting device and a sunlight collection unit according to an exemplary embodiment of the present invention.
Figure 7:
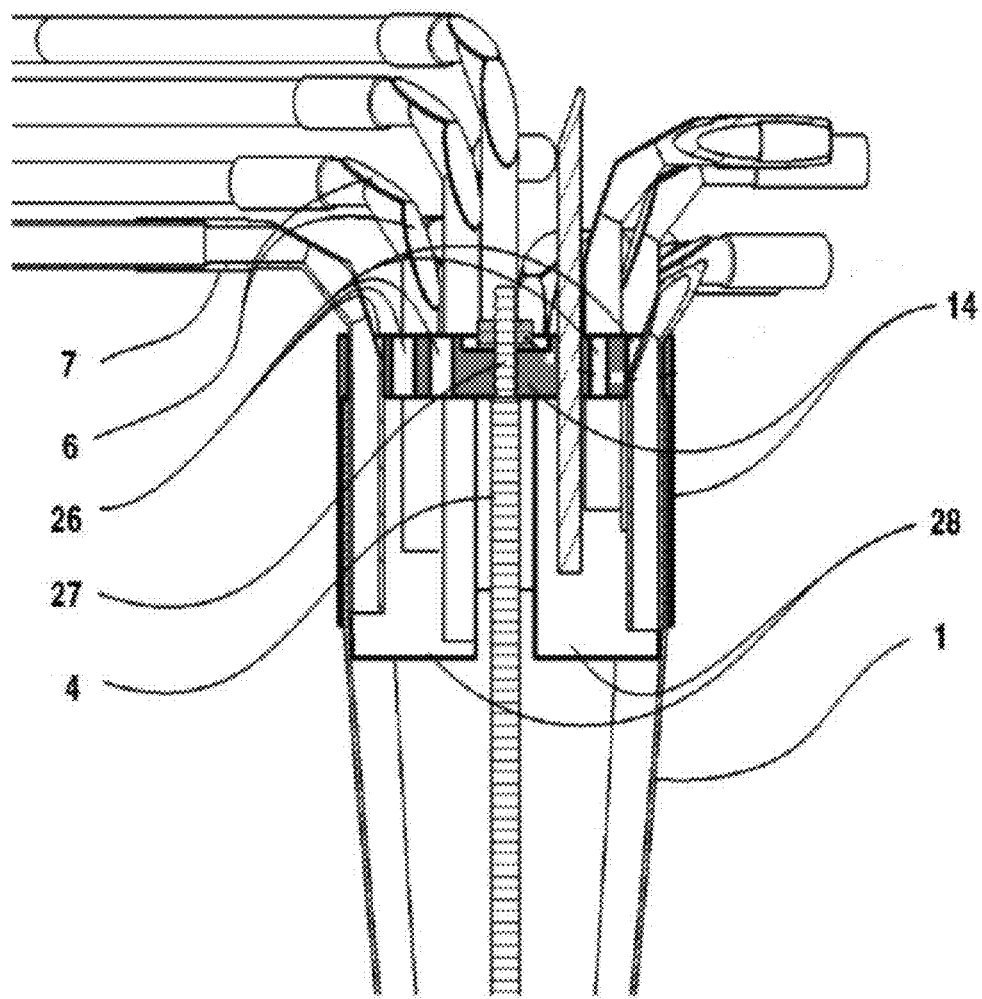
FIG. 7 is an exploded view of the sunlight collection unit shown in FIGS. 2-4.

FIG. 7 shows an exploded view of the sunlight collection unit shown in FIGS. 2-4.

The sunlight collection unit has a joint portion 7, a reflector 6, a pipe hole 26, a screw 27, and optical pipe holder 14, and a support 28.

In addition, a connection portion is formed integrally with the transmitting pipe combining light collecting device, and in order to a portion connected to the transmitting pipe combining light collecting device to perform total reflection, the connection portion enables a region having a slope of a contact point in which sunlight applied to a paraboloid reflects downward to exceed 90%.

Therefore, even when diffused reflection is applied to the transmitting pipe combining light collecting device 3, diffused reflection is emitted to a lower reflection port.

Figure 5:
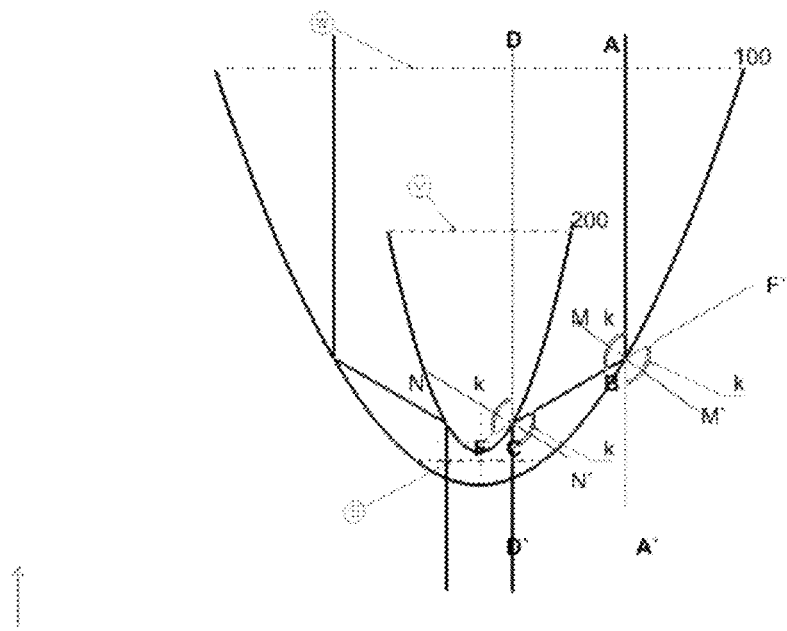
FIG. 5 illustrates a optic principle of parallel collecting according to an exemplary embodiment of the present invention.
Figure 6:
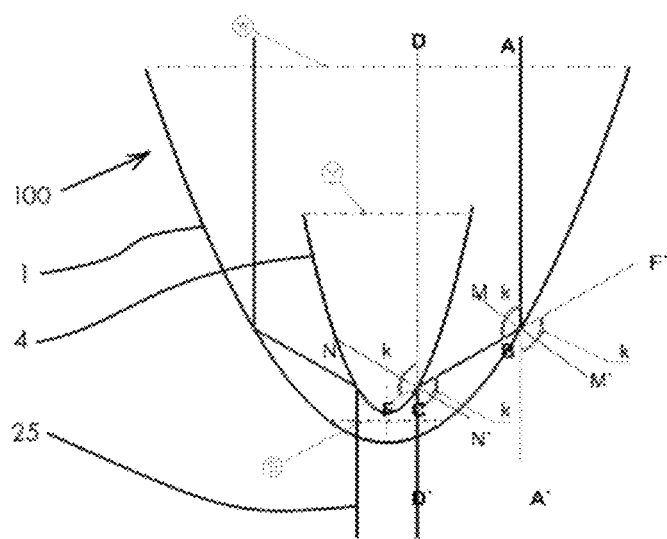
FIG. 6 is a perspective view illustrating a total reflection joint according to an exemplary embodiment of the present invention.

Further, FIG. 5 is a diagram illustrating a configuration of an entire network that collects sunlight using a condenser of the present invention and that transmits and uses sunlight to a remote place using a light pipe and an optical fiber, and the network is a system that can exchange sunlight between countries as well as a local area.

Modes for Carrying Out the Invention

Hereinafter, solving means of the present invention will be described in detail.

A paraboloid having a rapid second function value is formed so that a segment in which a tangent slope of a paraboloid of a first concave paraboloidal reflector is more than 40° becomes 90% or more, the first concave paraboloidal reflector has an opening in a lower portion of a focus, and a paraboloid condenser cell by coupling the first concave paraboloidal reflector and a wedge-shaped small second convex paraboloidal reflector formed in a lower portion of the inside of the first concave paraboloidal reflector while sharing the same focus is formed, a light pipe and light pipe elbow are coupled to a lower opening of a first condenser cell, the light pipe elbow forms a polygonal specular surface to emit light in one side direction, and a plurality of plane reflectors are coupled to a specular surface of a flexure portion, and by attaching a light pipe elbow for coupling a plurality of reflectors for reflecting sunlight in an applied angle and a light emitting angle larger than 45°, a first condenser cell is formed.

the first condenser cell forms a cover, and by transparently forming the cover, contamination of a reflector is prevented.

In an exemplary embodiment, as shown in FIG. 1, a first concave aspheric reflector corresponding to the first paraboloidal reflector 1 and a second convex aspheric reflector corresponding to the second paraboloidal reflector 4 are transparently integrally formed, and by shaping the second convex aspheric reflector in a hole form in an upper portion, the second convex aspheric reflector can be easily produced at one time, and in this case, in portions, except for a portion under a focus, parallel light, diffused reflection light, or entire applied light performs total reflection and is thus reflected to a lower light emitting port, In this case, when metal reflection coating is performed in the second convex aspheric reflector formed alone at the center, reflected light under a focus is reflected to the light emitting port and thus light collecting efficiency is enhanced.

As a means for super highly concentrating concentration light by combining in Multiple each concentration light collected at the first condenser cells, a method of connecting a light applying elbow of the sunlight collecting unit 3 and a lower light pipe elbow of each condenser cell with a light transmitting pipe is performed.

A light pipe, which is a transmitting means uses a hollow pipe shape and is made of glass or a metal, an inner surface thereof is processed to have gloss, and a light pipe that enhances a reflectivity by coating a reflector to a transparent pipe with a mirror processing is used, and a common glass fiber or an optical fiber of a synthetic resin material is used.

A hollow multi pipe formed with at least twofold clothes may be used, and by forming an inside pipe to have a refractive index larger than that of an outside pipe, total reflection easily occurs.

Particularly, a heat withdrawal system light pipe is a light pipe in which a first pipe at innermost of a multi pipe is a hollow pipe and in which a second pipe is formed at an outer edge of the first pipe, and the light pipe is formed by filling a liquid between the inside first pipe and the outside second pipe and exchanges a heat by absorbing a heat lost when transmitting light.

As shown in FIG. 3, in the sunlight collecting unit 3, at the outside, a first paraboloidal reflector forms a paraboloid having a second function value with a steep slope, an opening is formed in a direct lower portion adjacent to a focus of the paraboloid, i.e., a focus of a paraboloid is positioned between an upper point and a lower point of an upper opening, is formed at a distance adjacent to the lower point, and does not exceed 50 mm from the lower point, and the second convex paraboloidal reflector 4 is formed not to overpass a diameter width of 30 mm while sharing the focus, a cover is formed in an upper opening of the first concave paraboloidal reflector 4, and at the cover 14, a plurality of pipe holes that can insert and attach a light pipe are formed, and at a central axis of the cover 14, the second convex paraboloidal reflector 4 is coupled and attached to the support.

The second convex paraboloidal reflector 4 is characterized by screw combining to the support coupled and attached to a cover 14 and adjusting a focus position of the second convex paraboloidal reflector 4 and the first concave paraboloidal reflector 1 by adjusting a screw, As an optical transmission means, a light pipe is made of a metal, glass, or an optical fiber, and at a cover of the glass pipe, a reflective glass pipe coated with a reflector may be used, and in a Multiple glass pipe, a medium having a high refractive index is used for an inside pipe of the inside pipe and an outside pipe, and thus this is similar to a state in which a pupil is formed at an inside core of an optical fiber.

In another exemplary embodiment, space is formed between an inside pipe and an outside pipe with a multi-pipe, and the multi-pipe is formed by filling a solvent at this space, and as a solvent absorbs an optical loss heat while transmitting, an additional waste heat withdrawal system that absorbs a heat of a solvent and that exchanges the heat is provided, and an inside light pipe is made of a dense material, and a medium of a solvent that encloses the light pipe is thin, and thus light is transmitted by total reflection.

Further, first, second, third, fourth, and fifth pipes for transmitting the sunlight have reflective optical paths, respectively and individually perform a rotation motion at a position of a horizontal axis and a vertical axis.

That is, an elbow for connecting the first, second, third, fourth, and fifth pipes is fixed, but the first, second, third, fourth, and fifth pipes horizontally and vertically connected about each elbow can perform a vertical and lateral rotation.

In this way, a light transmitting pipe 2 has a rotation bending portion, and the light transmitting pipe 2 having Multiple rotation bending portions at a connection portion thereof connects two or more of the elbow, i.e., a rotation bending portion at every predetermined distance upon a remote place piping, and each elbow mounts a reflector 130 at a bent corner, and an applied angle and a reflection angle of the reflector are installed to correspond to a central axis of the elbow, and by continuously installing a plurality of elbows, as needed, the light transmitting pipe 2 that can increase flexibility, absorptiveness of a displacement, and buffering power is a rotation bending pipe.

This is characterized by transmitting sunlight in all directions or in an extensile and contractile direction of a pipe by providing flexibility and absorptiveness of a displacement to the light transmitting pipe 2, when inducing sunlight transmitted as high density parallel light that maintains linearity to a remote place, even if sunlight is moved by the light transmitting pipe 2.

Here, the reason of providing flexibility and absorptiveness of a displacement to the light transmitting pipe 2 is to limit an angle range to an angle within 45° while giving a reflection angle of two times to a reflected light path of sunlight that maintains linearity in order to provide flexibility and absorptiveness of a displacement to the light transmitting pipe 2, when inducing sunlight transmitted as high density parallel light that maintains linearity to a remote place by moving by the light transmitting pipe for transmitting sunlight through the first, second, third, fourth, and fifth pipes formed in a condenser.

That is, by giving a reflection angle of two times to a light transmitting pipe for collecting and transmitting sunlight of the present invention, i.e., by giving a first reflection angle of 22.5° and giving again a second reflection angle of 22.5°, sunlight is reflected to the outside to an angle within entire 45° and thus total reflection of sunlight occurs.

INDUSTRIAL APPLICABILITY

Sunlight of a natural state can be collected to a desired density, and highly collected sunlight can be transmitted to a remote place, and this provides many application fields, and by transmitting sunlight while forming a network to a short distance and a remote place, natural lighting can be performed to a shadow location within a building or a deep location of underground, and when light is collected with a center concentration method and thermal conversion is performed, solar thermal power generation can be performed using a high temperature heat, and sunlight as a thermal energy source can be used in an industrial blast furnace and be applied to a heat for a chemical reaction process, i.e., the present invention can be applied to various fields.

The invention claimed is:

1. Multiple sunlight collection structure, comprising a plurality of sunlight collecting structures and a sunlight collection unit,
   wherein the plurality of the sunlight collection structures collect incoming sunlight by performing total reflection of the incoming sunlight, concentrate sunlight by combining the collected sunlight in a multistage manner, and transmit the concentrated sunlight in parallel outside the sunlight collecting structures,
   wherein each of the plurality of the sunlight collecting structures includes:
   a first paraboloidal reflector forming an inner peripheral surface, wherein an applied angle of an applied sunlight on each point of the inner peripheral surface is larger than a critical angle for total reflection of the applied sunlight, and at least 90% of the paraboloidal surface of the inner peripheral surface has a tangential slope of more than 40 degrees in each segment of the paraboloidal surface; and
   a second paraboloidal reflector positioned inside the first paraboloidal reflector and sharing a same focus with the first paraboloidal reflector, and
   wherein the opening for transmitting sunlight totally reflected from the second paraboloidal reflector is formed at a lower portion of the first paraboloidal reflector,
   wherein the opening is equipped with a light transmitting pipe for transmitting sunlight collected through the first paraboloidal reflector and the second paraboloidal reflector,
   wherein the sunlight collection unit collects sunlight transmitted from a respective light transmitting pipe, and comprises a first paraboloidal mirror and a second paraboloidal mirror,
   wherein an optic pipe holder is formed in an upper opening of the first paraboloidal mirror,
   wherein the optic pipe holder has a plurality of pipe holes that insets and attaches a plurality of light pipe vertically, and at a central axis of the optic pipe holder, the second paraboloidal mirror is coupled and attached to a support,
   wherein the critical angle is defined as the minimum angle of incidence of the applied sunlight for which total reflection occurs, wherein the angle of incidence is the angle between the applied sunlight incident on a surface and the line perpendicular to the surface at the point of incidence.

2. The multiple sunlight collection structure of claim 1, wherein the sunlight collection unit comprises:
   the first paraboloidal mirror forming a second inner peripheral surface, wherein an applied angle of a second sunlight on each point of the second inner peripheral surface is larger than a critical angle for total reflection of the second sunlight, wherein the second sunlight is applied from a respective light transmitting pipe, and the second paraboloidal mirror positioned inside the first paraboloidal mirror and sharing a same focus with the first paraboloidal mirror.

3. The multiple sunlight collection structure of claim 2, wherein a second opening is formed at a lower portion of the sunlight collection unit, and the second opening is equipped with a second light transmitting pipe for transmitting sunlight collected through the first paraboloidal mirror and the second paraboloidal mirror.

4. The multiple sunlight collection structure of claim 3, wherein one or more joint portion is formed at one side of the second light transmitting pipe, and the joint portion is equipped with one or more reflector for reflected sunlight to perform total reflection.

5. The multiple sunlight collection structure of claim 4, wherein the joint portion of the second light transmitting pipe can rotate.

* * * * *